(12) United States Patent
Pera

(10) Patent No.: US 7,719,361 B2
(45) Date of Patent: May 18, 2010

(54) DIFFERENTIAL AMPLIFIER WITH CURRENT SOURCE CONTROLLED THROUGH DIFFERENTIAL FEEDBACK

(75) Inventor: Florin Pera, Kanata (CA)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 115 days.

(21) Appl. No.: 11/581,563

(22) Filed: Oct. 16, 2006

(65) Prior Publication Data

US 2008/0106336 A1  May 8, 2008

(51) Int. Cl.
*H03F 3/45* (2006.01)
(52) U.S. Cl. ...................................... 330/260
(58) Field of Classification Search .......... 330/259–261
See application file for complete search history.

(56) References Cited

U.S. PATENT DOCUMENTS

| | | | |
|---|---|---|---|
| 4,088,962 A * | 5/1978 | Trilling | ....................... 330/261 |
| 5,311,144 A | 5/1994 | Grasset | |
| 5,613,233 A | 3/1997 | Vagher | |
| 6,150,883 A | 11/2000 | Ivanov | |
| 6,559,720 B1 | 5/2003 | Huijsing et al. | |
| 6,753,732 B1 | 6/2004 | Moreland | |
| 6,822,512 B2 | 11/2004 | Brokaw | |
| 7,138,866 B2 * | 11/2006 | Etoh | ........................ 330/253 |
| 7,253,686 B2 * | 8/2007 | Ali | ............................. 330/259 |

OTHER PUBLICATIONS

European Search Report Appln. No. 07117579.8-2215, dated March 8, 2008.
R. Jacob Baker; "CMOS Circuit Design, Layout, and Simulation", IEEE Press, Second Edition, 2005, pp. 868-869; 872-873.

* cited by examiner

*Primary Examiner*—Robert Pascal
*Assistant Examiner*—Hieu P Nguyen
(74) *Attorney, Agent, or Firm*—RatnerPrestia

(57) ABSTRACT

A differential amplifier includes a first electrical path formed between a first transistor and a first load impedance; a second electrical path formed between a second transistor and a second load impedance; a tail-current transistor coupled to the first and second transistors; an input end of a feedback amplifier coupled directly to the first and second electrical paths for receiving a differential voltage output signal; and an output end of the feedback amplifier coupled directly to the tail-current transistor for adjusting the current provided through each of the first and second electrical paths. The feedback amplifier includes a non-inverting input node and an inverting input node, each node coupled directly to one or the other of the first and second electrical paths.

12 Claims, 8 Drawing Sheets

DIFFERENTIAL AMPLIFIER WITH CURRENT SOURCE CONTROLLED THROUGH DIFFERENTIAL FEEDBACK

FIELD OF THE INVENTION

The present invention relates, in general, to a differential amplifier. More specifically, the present invention relates to a high gain, single stage differential amplifier with a current source that is controlled through differential feedback.

BACKGROUND OF THE INVENTION

Differential amplifiers are electronic devices for amplifying a voltage difference between two input signals. A differential amplifier typically includes two electrical paths that are independently coupled to a voltage source at one end, and that are together coupled to a voltage or current source at an opposite end. Each electrical path usually includes a transistor element and a resistance element. Two differential input signals may be applied to the transistor elements, and a differential output signal may be extracted from each electrical path between its transistor element and resistance element. The two electrical paths are usually designed to substantially match each other, such that components common to both differential input signals are cancelled and a voltage difference signal between the input signals is amplified.

A conventional differential amplifier may have its pair of emitters (in case of bipolar transistors), or its pair of sources (in case of metal-oxide-semiconductor (MOS) transistors) tied together to a current source. Such current source supplies a fixed tail-current to each transistor of the differential amplifier. When supplied with a fixed tail-current, the differential amplifier may have a gain of only 6 to 12 dB. In order to increase the gain of the differential amplifier, differential cascaded amplifiers are necessary, thus making the circuit more complex.

In addition, for wideband frequency circuit applications, a conventional high amplifier requires frequency compensation components, which may be achieved with the addition of compensation capacitors in the circuit. This further complicates the operation of the differential amplifier and deteriorates other dynamic performance characteristics of the amplifier, such as its response time.

As will be explained, one embodiment of the present invention provides a differential amplifier having a high gain of approximately 50 to 60 dB. This high gain is advantageously achieved with a single amplification stage, without any need for cascaded arrangement of amplifier stages.

SUMMARY OF THE INVENTION

To meet this and other needs, and in view of its purposes, the present invention provides a differential amplifier including a first electrical path formed between a first transistor and a first load impedance; a second electrical path formed between a second transistor and a second load impedance; a tail-current transistor coupled to the first and second transistors for providing a current through each of the first and second electrical paths; a differential voltage output signal provided directly between the first and second electrical paths; an input end of a feedback amplifier coupled directly to the first and second electrical paths for receiving the differential voltage output signal; and an output end of the feedback amplifier coupled directly to the tail-current transistor for adjusting the current provided through each of the first and second electrical paths. The feedback amplifier includes a non-inverting input node and an inverting input node, each coupled directly to one or the other of the first and second electrical paths.

The differential amplifier further includes third and fourth electrical paths coupled, respectively, to first and second biasing nodes of the first and second transistors for providing a differential voltage input signal between the first and second biasing nodes. In addition, the inverting and non-inverting input nodes, respectively, of the feedback amplifier are connected directly to the first and second collectors, and the output end of the feedback amplifier is connected directly to an input node of the tail-current transistor. The first and second electrical paths provide the differential voltage output as a single stage of amplification with respect to the third and fourth electrical paths. The feedback amplifier is configured to increase the current provided through each of the first and second electrical paths and, in turn, substantially increase a gain value of the single stage of amplification.

The first load impedance of the differential amplifier is Z1, the second load impedance is Z2, and a differential gain value of the differential amplifier, $A_{vdiff}$, includes the following expression:

$$A_{vdiff} = g_m * (Z2+Z1)/(2-g_{mt}*A_{vfb}*(Z2-Z1))$$

where:

$g_m$=transconductance of the first and second transistors;

$g_{mt}$=transconductance of the tail-current transistor; and $A_{vfb}$=a gain value of the feedback amplifier.

A single ended gain value of the differential amplifier, $A_{vop}$, includes the following expression:

$$A_{vop} = (g_m*Z2/2) + [(g_{mt}*A_{vfb}*Z2)*A_{vdiff}]/2$$

where:

$g_m$=transconductance of the first and second transistors;

$g_{mt}$=transconductance of the tail-current transistor; and $A_{vfb}$=a gain value of the feedback amplifier.

Another embodiment of the present invention is a differential amplifier including a first electrical path formed between a first transistor and a first load impedance; a second electrical path formed between a second transistor and a second load impedance; a first tail-current transistor coupled to the first transistor for providing a first current through the first electrical path; a second tail-current transistor coupled to the second transistor for providing a second current through the second electrical path; a differential voltage output signal provided directly between the first and second electrical paths; a first feedback path coupled directly between the first electrical path and one of either a first input node of the first tail-current transistor or a second input node of the second tail-current transistor; and a second feedback path coupled directly between the second electrical path and one of either the second input node of the second tail-current transistor or the first input node of the first tail-current transistor.

The differential amplifier further includes third and fourth electrical paths coupled, respectively, to first and second biasing nodes of the first and second transistors for providing a differential voltage input signal between the first and second biasing nodes. A third impedance is connected directly between an output node of the first transistor and an output node of the second transistor.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

As will be explained, an embodiment of the present invention provides a differential amplifier having a high gain of approximately 50 to 60 dB. This high gain is advantageously achieved with a single amplification stage, without any need for complicated transistor arrangements, such as cascaded amplifier arrangements or frequency compensation arrangements.

Figure 1:
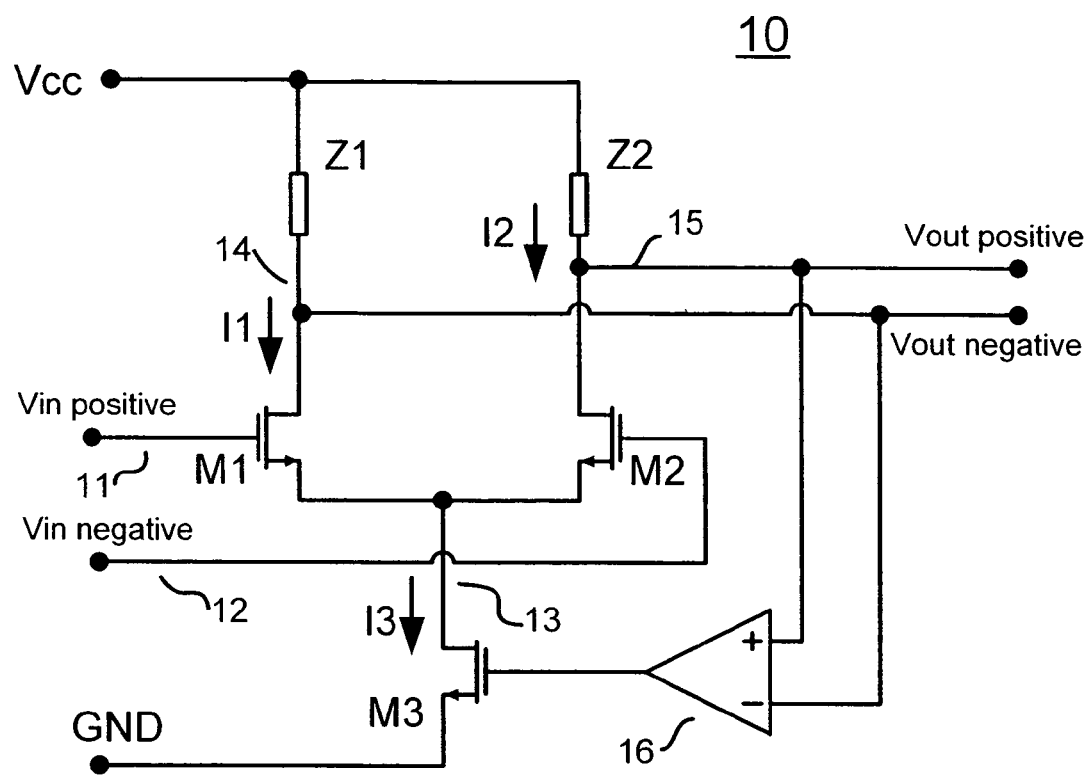
FIG. 1 is a schematic diagram of a high gain, single stage differential amplifier using N-type MOS (NMOS) transistors, in accordance with an embodiment of the present invention.

Referring to FIG. 1, there is shown a single stage differential amplifier, generally designated as 10. Differential amplifier 10 includes a pair of transistors M1 and M2, tail-current transistor M3 and impedance load elements Z1 and Z2. One end of each of the impedance loads is connected to a positive voltage potential of Vcc, and one end of tail-current transistor M3 is connected to another voltage potential, such as a ground potential.

As shown, transistor M1 and impedance load element Z1 form a first electrical path, while transistor M2 and impedance load element Z2 form a second electrical path. The first electrical path, designated as 14 provides a Voutput negative voltage of the differential amplifier and the second electrical path, designated as 15, provides a Voutput positive voltage of the differential amplifier. The Voutput positive and Voutput negative voltages provide the amplified differential output signal of differential amplifier 10.

The differential amplifier 10 may be used as a single ended output amplifier by connecting an output load (not shown) between the Voutput positive node and the ground terminal. The differential amplifier 10 may be used as another single ended output amplifier by connecting the output load (not shown) between the Voutput negative node and the ground terminal.

The input biasing node of transistor M1 (or the gate of NMOS transistor M1, as shown in FIG. 1) is connected to electrical path 11 for receiving the Vinput positive voltage. The input biasing node of transistor M2 (or the gate of NMOS transistor M2, as shown in FIG. 1) is connected to electrical path 12 for receiving the Vinput negative voltage. Complex impedance load Z1 is connected between the output node of transistor M1 (or the drain of NMOS transistor M1, as shown) and the supply voltage reference of Vcc. Complex impedance load Z2 is connected between the output node of transistor M2 (or the drain of NMOS transistor M2, as shown) and the supply voltage reference of Vcc.

Another output node of transistor M1 (or the source of NMOS transistor M1, as shown in FIG. 1) and the other output node of transistor M2 (or the source of NMOS transistor M2, as shown in FIG. 1) are connected together and coupled, by way of electrical path 13, to an output node of tail-current transistor M3 (or the drain of NMOS transistor M3, as shown). The other output node of tail-current transistor M3 (or the source of NMOS transistor M3, as shown) is connected to a ground potential reference. The input biasing node of tail-current transistor M3 (or the gate of tail-current transistor M3) is connected to the output node of feedback amplifier 16. The non-inverting input node and the inverting input node of feedback amplifier 16 are directly connected, respectively, to electrical path 15 and electrical path 14, which provide the Voutput positive and Voutput negative voltages.

As shown in FIG. 1, the feedback path is provided from one end, directly beginning at the differential output nodes of differential amplifier 10 to the other end, directly ending at the input bias node (or gate) of tail-current transistor M3. In operation, as the output voltage from feedback amplifier 16 increases, the current flowing through electrical path 13 also increases. Similarly, when the output voltage from feedback amplifier 16 decreases, the current flowing through electrical path 13 also decreases. This change of current value through electrical path 13, correspondingly changes the current value through each of electrical paths 14 and 15. It will be appreciated that the current I3 flowing through electrical path 13 is substantially equal to the sum of the currents flowing through electrical path 14 and electrical path 15, namely I1 and I2.

Impedance load elements Z1 and Z2 may each include a resistor, a capacitor, an inductor, or any combination of resistor, capacitor and inductor. Furthermore, impedance load elements Z1 and Z2 may each be formed from passive elements or active elements. If these impedances are formed from active elements, the impedances may be controlled and adjusted through various transistor elements. The impedance load elements shown in FIG. 1 are formed from passive elements only. Impedance load elements Z1 and Z2 may be of different values from each other or may be of the same values.

The electrical paths 14 and 15 may be designed to substantially match each other, such that components common to both differential input signals are cancelled out and only a voltage difference between the input signals is amplified. In such case, impedance load element Z1 is designed to substantially match impedance load element Z2; and transistor M1 is designed to substantially match transistor M2. As will be explained later, depending on the particular application, electrical paths 14 and 15 may also be designed to be different from each other by selecting a value for Z1 that is different from the value of Z2 and/or selecting transistor M1 to be different from transistor M2. By selecting different and/or similar values for Z1 versus Z2 and M1 versus M2, the transfer function of the feedback loop may changed to allow differential amplifier 10 to be used for different applications. It will be appreciated that the transfer function of the feedback loop depends on all of the following elements shown in FIG. 1, namely Z1, Z2, M1, M2, M3, and feedback amplifier 16.

Without the feedback path through feedback amplifier 16, the current flowing to bias each of the differential pairs of transistors M1 and M2 is substantially fixed in value. With the bias current fixed in value, the amplification gain provided by the differential pair of transistors is limited to approximately 6 to 12 dB. With the feedback amplifier in the feedback path, however, differential amplifier 10 provides an amplification gain of approximately 50 to 60 dB between any single ended differential output node to ground (either the Voutput positive node to ground or the Voutput negative node to ground) and the differential input nodes.

It will be appreciated that the present invention provides a simple circuit arrangement of components, as shown in FIG. 1. Transistors M1 and M2 provide a single stage of amplification with the biasing of transistors M1 and M2 controlled by feedback amplifier 16, which controls the tail-current of tail-current transistor M3. Feedback amplifier 16 operates in a linear gain mode and supplies a voltage into the input node of transistor M3, so that there is always a tail-current flowing through electrical path 13. In the example shown in FIG. 1, the voltage provided by feedback amplifier 16 is the gate to source voltage (VGS) that establishes the tail-current I3 flowing through transistor M3.

In operation, the current flowing through transistor M1 or M2 increases, when the tail-current flowing through transistor M3 increases. The increase of current flowing through transistor M1 or M2, in turn, increases the single ended amplification gain of differential amplifier 10. Furthermore, if the current flowing through transistor M1 or M2 increases, then the voltage drop across impedance element Z1 or Z2, respectively, also increases, thereby providing a smaller voltage at the Voutput positive node or a smaller voltage at the Voutput negative node. This, in turn, affects the voltage output of feedback amplifier 16 in a different manner. When the voltage output at first electrical path 14 is increased, the voltage output of feedback amplifier 16 is decreased. When the voltage output at second electrical path 15 is increased, on the other hand, the voltage output of feedback amplifier 16 is increased. This different effect provides a negative feedback due to the first electrical path 14 but a positive feedback due to the second electrical path 15.

In operation, a differential input signal present between the Vinput positive node and the Vinput negative node is amplified by the M1 and M2 differential pair of transistors and translated into a differential output signal at the Voutput positive node and the Voutput negative node. Furthermore, the Voutput positive signal and the Voutput negative signal are fed back, through feedback amplifier 16, into the tail-current transistor M3. The feedback loop, it will be understood, includes feedback amplifier 16, transistors M1, M2 and M3, and load impedances Z1 and Z2. The feedback loop further amplifies the differential output signal (Voutput positive–Voutput negative).

When the M1 and M2 transistors and the Z1 and Z2 impedances are substantially symmetrical and matched to each other, the action of the feedback loop is primarily of a common mode type. In other words, the feedback loop either pulls up or pulls down both the Voutput positive signal and the Voutput negative signal in the same direction (in phase, or in a common mode).

The gain of the differential amplifier, as a single ended output signal, may be defined as follows:

(Voutput positive)/(Vinput positive–Vinput negative).

The gain is substantially higher than the intrinsic gain of the M1, M2 differential stage, because of the presence of the feedback loop through the tail-current transistor M3.

In another embodiment, when the M1 and M2 transistors and/or the Z1 and Z2 impedance loads are not symmetrical (or not equal), the feedback path through the feedback amplifier and the tail-current transistor has both a common mode effect and a differential mode effect upon the Voutput positive signal, or the Voutput negative signal (in a single ended application). In such non-symmetrical electrical paths, the differential gain components formed by the DC offset in M1 and M2 and/or Z1 and Z2 provide a further change in the common mode output gain. In addition, the DC offset of the differential amplifier is modified by the asymmetry level in the feedback loop components (for example, M1 versus M2 or Z1 versus Z2).

The gain of the differential amplifier may be increased or decreased by modifying the transfer function (or the filtering characteristics) of the feedback loop components (feedback amplifier 16, M1, M2, M3, Z1 and Z2). In summary, the gain (or the transfer characteristics) of differential amplifier 10 is a function of (1) the M1, M2 differential stage gain, (2) the feedback loop gain, including feedback amplifier 16, the M1, M2 transistor pair, the tail-current transistor M3, and the Z1, Z2 load elements, and (3) the degree of asymmetry in the feedback loop.

Figure 2A:
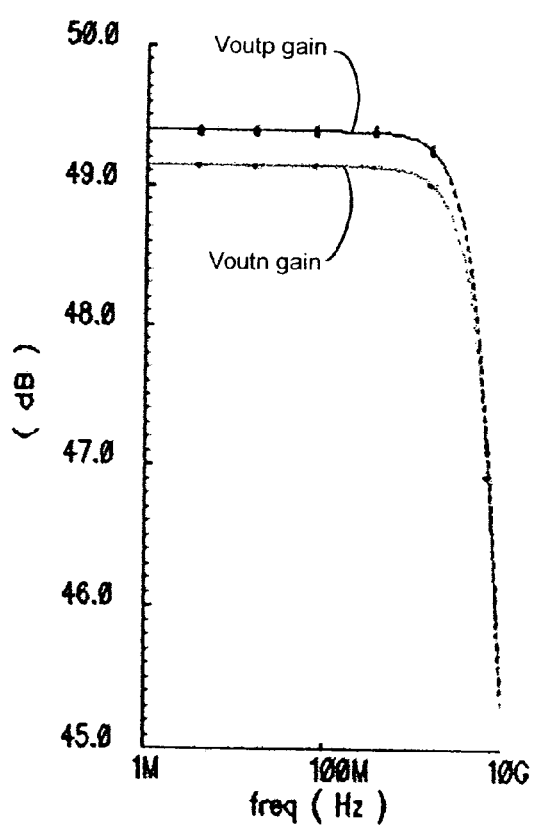
FIG. 2A shows the gain performance of the differential amplifier of FIG. 1, by presenting a plot of the gain of the Voutput positive node with respect to ground (the single ended gain output) versus frequency and another plot of the gain of the Voutput negative node with respect to ground (the single ended gain output) versus frequency.

Referring next to FIG. 2A, there is shown the gain of the Voutput positive node (single ended) and the Voutput negative node (single ended) as a function of frequency. The results of FIG. 2A assume that the M1 transistor is symmetrical to the M2 transistor and the Z1 impedance element is similar to the Z2 impedance element. The intrinsic gain (without feedback) of the differential pair of transistors M1, M2 is approximately 12 dB and the gain of feedback amplifier 16 is approximately 20 dB. As shown in FIG. 2A, the overall gain of differential amplifier 10 is approximately 50 dB. The current I3 flowing in the tail-current transistor M3 is set to approximately 1 mA.

Figure 2B:
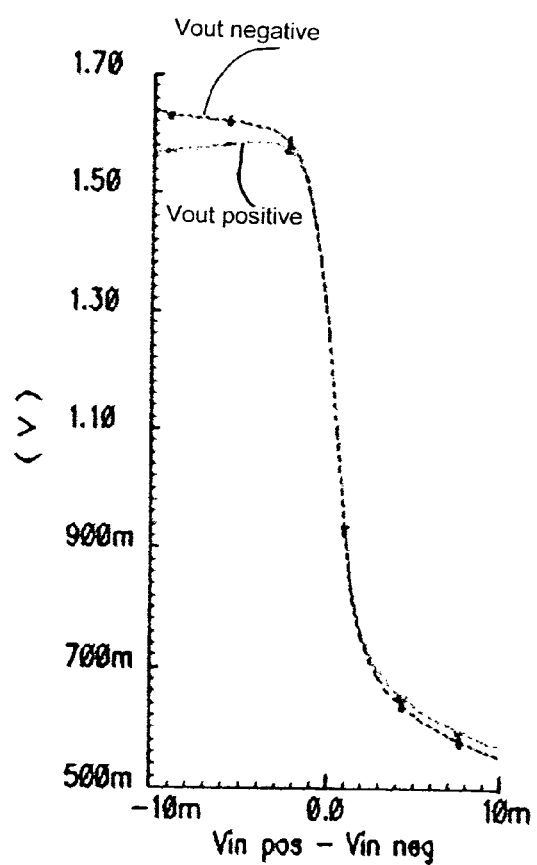
FIG. 2B shows the single ended performance of the differential amplifier of FIG. 1, by presenting a plot of the voltage at the Voutput positive node versus the differential input voltage and another plot of the voltage at the Voutput negative node versus the differential input voltage.

Referring next to FIG. 2B, there is shown the two single ended output signals, namely the Voutput positive signal and the Voutput negative signal versus the differential input signal (Vinput positive–Vinput negative). The differential amplifier 10 is set to operate during the nonlinear portion of the curve shown in FIG. 2B. The large slope of the curve indicates a high level of gain for differential amplifier 10. The voltage level of Vcc is set to approximately 2.0 volts.

Figure 2C:
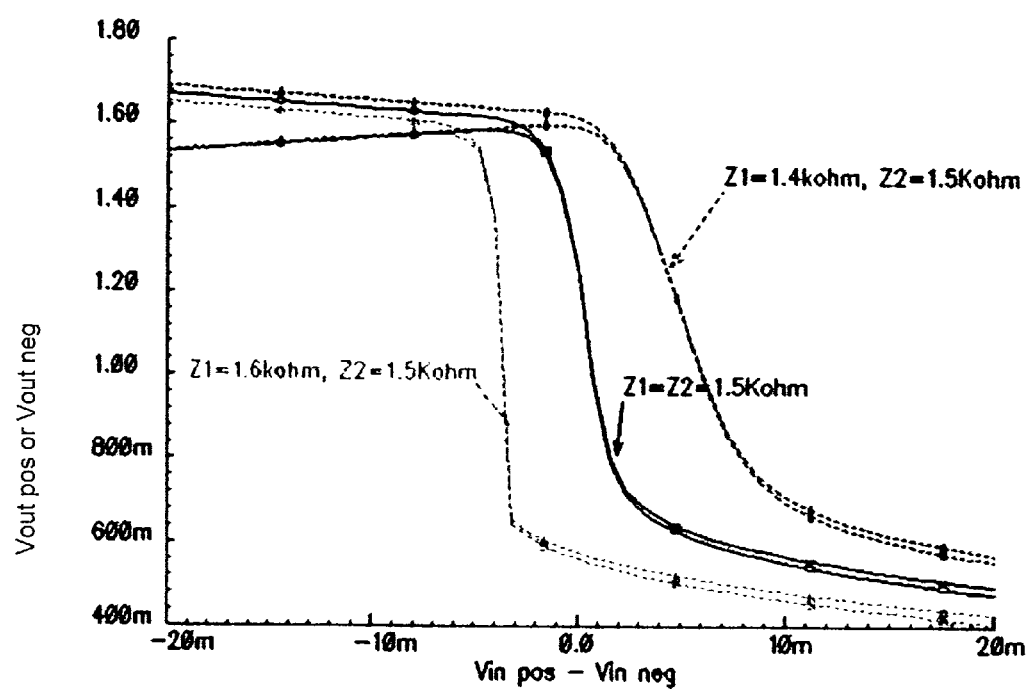
FIG. 2C shows the single ended performance of the differential amplifier of FIG. 1, by presenting plots that are similar to the plots shown in FIG. 2B, except that Z1 and Z2 have different values.

Referring next to FIG. 2C, there is shown the effect of Z1 and Z2 being different from each other (or nonsymmetrical). Three different sets of curves are shown. The first set of curves shows the result of Z1 having a value of 1.6 Kohm and Z2 having a value of 1.5 Kohm; the second set of curves is the result of the impedance values of Z1 set equal to the impedance values of Z2, where each is 1.5 Kohm. The third set of curves includes the result of Z1 set to 1.4 Kohm and Z2 set to 1.5 Kohm. It will be observed that when Z1 and Z2 are not symmetrical an offset voltage is introduced.

When Z1 is equal to Z2, the single ended output voltage varies between approximately 1.5 volts and 650 mv. Such output voltage variation is produced at an approximate input differential signal having a small variation about 0.0 volts. On the other hand, when Z1 is not symmetrical to Z2, the two single ended output voltages transition at a Vinput differential offset of −3.5 mv in one set of curves, and a Vinput differential offset of +6 mv in another set of curves. It will also be observed that the gain of differential amplifier 10 has the greatest value, when Z1 is equal to 1.6 Kohm and Z2 is equal to 1.5 Kohm. The gain of differential amplifier 10 has the smallest value, however, when Z1 is equal to 1.4 Kohm and Z2 is equal to 1.5 Kohm.

Figure 3:
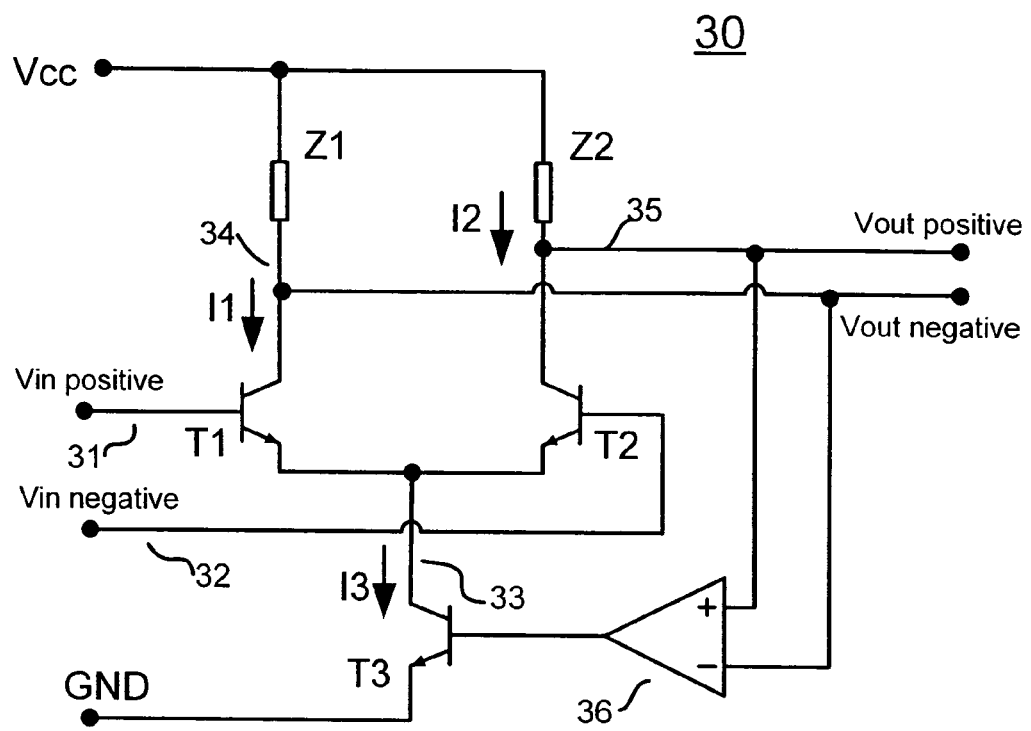
FIG. 3 is a schematic diagram of a high gain, single stage differential amplifier using bipolar transistors, in accordance with an embodiment of the present invention.

Referring now to FIG. 3, there is shown another differential amplifier, which is similar to differential amplifier 10, except that the transistors shown are bipolar transistors. The single stage differential amplifier, generally designated as 30, includes a pair of transistors T1 and T2, tail-current transistor T3 and impedance load elements Z1 and Z2. One end of each of the impedance loads is connected to a positive voltage potential of Vcc, and one end of tail-current transistor T3 is connected to another voltage potential, such as a ground potential.

As shown in FIG. 3, transistor T1 and impedance load element Z1 form a first electrical path, while transistor T2 and impedance load element Z2 form a second electrical path. The first electrical path, designated as 34, provides a Voutput negative voltage of the differential amplifier and the second electrical path, designated as 35, provides a Voutput positive voltage of the differential amplifier. The Voutput positive and Voutput negative voltages provide the amplified differential output signal of single stage differential amplifier 30.

The differential amplifier 30 may be used as a single ended output amplifier by connecting an output load (not shown) between the Voutput positive node and the ground terminal. The differential amplifier 30 may be used as another single ended output amplifier by connecting the output load (not shown) between the Voutput negative node and the ground terminal.

The input biasing node of transistor T1 (or the base of bipolar transistor T1) is connected to electrical path 31 for receiving the Vinput positive voltage. The input biasing node of transistor T2 (or the base of bipolar transistor T2) is connected to electrical path 32 for receiving the Vinput negative voltage. Complex impedance load Z1 is connected between the output node of transistor T1 (or the collector of bipolar transistor T1) and the supply voltage reference of Vcc. Complex impedance load Z2 is connected between the output node of transistor T2 (or the collector of bipolar transistor T2) and the supply voltage reference of Vcc.

Another output node of transistor T1 (or the emitter of bipolar transistor T1) and the other output node of transistor T2 (or the emitter of bipolar transistor T2) are connected together and coupled, by way of electrical path 33, to an output node of tail-current transistor T3 (or the collector of bipolar transistor T3). The other output node of tail-current transistor T3 (or the emitter of bipolar transistor T3) is connected to a ground potential reference. The input biasing node of tail-current transistor T3 (or the base of tail-current transistor T3) is connected to the output node of feedback amplifier 36. The non-inverting input node and the inverting input node of feedback amplifier 36 are directly connected, respectively, to electrical path 35 and electrical path 34, which provide the Voutput positive and Voutput negative voltages.

Similar to the differential amplifier of FIG. 1, differential amplifier 30 includes impedance load elements Z1 and Z2, which may each include a resistor, a capacitor, an inductor, or any combination of resistor, capacitor and inductor. The impedance load elements shown in FIG. 3 are formed from passive elements only. Impedance load elements Z1 and Z2 may be of different values from each other or may be of the same value.

The electrical paths 34 and 35 may be designed to substantially match each other, such that components common to both differential input signals are cancelled out and only a voltage difference between the input signals is amplified. In such case, impedance load element Z1 is designed to substantially match impedance load element Z2; and transistor T1 is designed to substantially match transistor T2. Depending on the particular application, electrical paths 34 and 35 may also be designed to be different from each other by selecting a value for Z1 that is different from a value of Z2 and/or selecting transistor T1 of a size that is different from a size of transistor T2. By selecting different and/or similar values for Z1 versus Z2 and T1 versus T2, the transfer function of the feedback loop may be changed to allow differential amplifier 30 to be used for different applications. Similar to differential amplifier 10, the transfer function of the feedback loop shown in FIG. 3 depends on all of the following elements: Z1, Z2, T1, T2, T3, and feedback amplifier 36.

As an example, differential amplifier 30 shown in FIG. 3 is further explained by way of equations depicting the differential output gain and the single ended output gain of the amplifier.

The differential output gain, $A_{vdiff}$, may be defined as follows:

$$A_{vdiff} = \delta(V_{out\,pos} - V_{out\,neg}) / \delta(V_{in\,pos} - V_{in\,neg})$$

The single ended output gain (single ended Vout positive gain, $A_{vop}$, and single ended Vout negative gain, $A_{von}$, may be defined as follows:

$$A_{vop} = \delta(V_{out\,pos}) / \delta(V_{in\,pos} - V_{in\,neg})$$

and $$A_{von} = \delta(V_{out\,neg}) / \delta(V_{in\,pos} - V_{in\,neg})$$

The above three equations may be rewritten as follows:

$$A_{vdiff} = g_m * (Z2 + Z1) / (2 - g_{mt} * A_{vfb} * (Z2 - Z1)) \quad \text{Eq. (1)}$$

$$A_{vop} = (g_m * Z2/2) + [(g_{mt} * A_{vfb} * Z2) * A_{vdiff}]/2 \quad \text{Eq. (2)}$$

$$A_{von} = -(g_m * Z1/2) + [(g_{mt} * A_{vfb} * Z1) * A_{vdiff}]/2 \quad \text{Eq. (3)}$$

where:
$g_m$ = T1 and T2 transconductance;
$g_{mt}$ = T3 transconductance;
$A_{vfb}$ = feedback amplifier 36 gain;

It may be seen from the above that when Z1 is equal to Z2, the differential gain of amplifier 30 is as follows:

$$A_{vdiff} = g_m * (Z2 + Z1)/2$$

This is the intrinsic differential stage gain. The feedback loop does not have any influence on the differential gain, when Z1=Z2.

Figure 4:
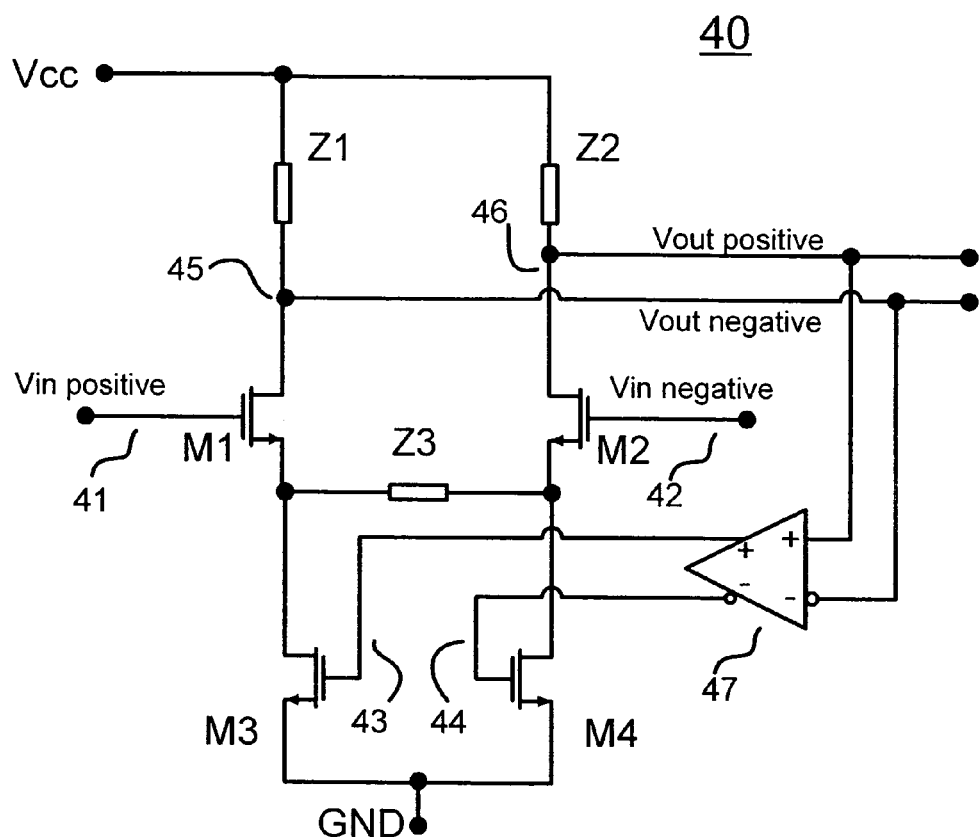
FIG. 4 is a schematic diagram of a single stage differential amplifier using NMOS transistors, in accordance with another embodiment of the present invention.

Yet another embodiment of the invention is shown in FIG. 4 as differential amplifier 40. The differential amplifier 40 is similar to differential amplifier 10 of FIG. 1, except that the differential pair of M1 and M2 are degenerated by impedance element Z3, which is disposed between the source nodes of transistors M1 and M2. In addition, feedback amplifier 47 includes an inverting output signal and a non-inverting output signal, which are provided, respectively, to the input gates of transistor M4 and transistor M3. Thus, the output node of feedback amplifier 16, shown in FIG. 1, is now shown in FIG. 4 as split into two output nodes which feed transistor M3 and transistor M4.

Furthermore, differential amplifier 40 includes two tail-current transistors M3 and M4, whereas differential amplifier 10 only included one tail-current transistor M3. As shown in FIG. 4, feedback amplifier 47 includes a differential input signal provided between first and second electrical paths 45 and 46, and a differential output signal provided between electrical paths 43 and 44. The differential output signal controls the biasing of transistors M3 and M4.

It will be appreciated that impedance element Z3 may have values that include, for example, a short (zero ohms), a resistor, or a complex impedance. In this manner, impedance element Z3 provides a selective differential and common mode gain for amplifier 40. When impedance element Z3 is a short, then the differential feedback is cancelled. When impedance element Z3 is resistive in value, the differential stage gain of amplifier 40 is reduced. Although impedance element Z3 may reduce the differential stage gain of amplifier 40, nevertheless, the total gain of amplifier 40 may still be comparable to the large gain obtained by differential amplifier 10 (FIG. 1). In addition, impedance element Z3 together with the two separate tail-current transistors M3 and M4 offer extended flexibility in obtaining various transfer functions for amplifier 40. As an example, amplifier 40 may be used as an equalizer for the purpose of accentuating the high frequency components of an input signal.

Referring to FIG. 4, differential amplifier 40 includes a pair of transistors M1, M2, two tail-current transistors M3, M4 and impedance load elements Z1 and Z2. The degenerating impedance element Z3 is disposed between the sources of transistors M1 and M2. One end of each of the impedance loads is connected to a positive voltage potential of Vcc, and one end of each tail-current transistor M3 and M4 is connected to another voltage potential, such as a ground potential.

Similar to FIG. 1, transistor M1 and impedance load element Z1 form a first electrical path, while transistor M2 and impedance level element Z2 form a second electrical path. The first electrical path, designated as 45, provides a Voutput negative voltage of the differential amplifier and the second electrical path, designated as 46, provides a Voutput positive voltage of the differential amplifier. The Voutput positive and Voutput negative nodes provide the amplified differential output signal of differential amplifier 40. The input biasing node of transistor M1 is connected to electrical path 41 for receiving the Vinput positive voltage. The input biasing node of transistor M2 is connected to electrical path 42 for receiving the Vinput negative voltage.

Also similar to differential amplifier 10, impedance load elements Z1 and Z2, as well as degenerating impedance element Z3 may include a resistor, a capacitor, an inductor, or any combination of resistor, capacitor and inductor. The first and second electrical paths 45 and 46 may be designed to substantially match each other, such that components common to both differential input signals are canceled out and only a voltage difference between the input signals is amplified. In such case, impedance load element Z1 is designed to substantially match impedance load element Z2; and transistor M1 is designed to substantially match the size of transistor M2. Depending on the particular application, first and second electrical paths 45 and 46 may also be designed to be different from each other, by selecting a value for Z1 that is different from a value of Z2 and/or selecting transistor M1 to be different from transistor M2. By selecting different and/or similar values for Z1 versus Z2 and M1 versus M2, the transfer function of the feedback loop may be changed to allow differential amplifier 40 to be used for different applications. It will be appreciated that the transfer function of the feedback loop depends on all of the following elements shown in FIG. 4: Z1, Z2, Z3, M1, M2, M3, M4, and feedback amplifier 47.

Differential amplifier 40 may also include another variation, whereby feedback amplifier 47 includes its non-inverting input node connected to the Voutput negative node and its inverting input node connected to the Voutput positive node. Similarly, the non-inverting output node of feedback amplifier 47 may be connected to the input gate of transistor M4, and the inverting output node of feedback amplifier 47 may be connected to the input gate of transistor M3.

Figure 5:
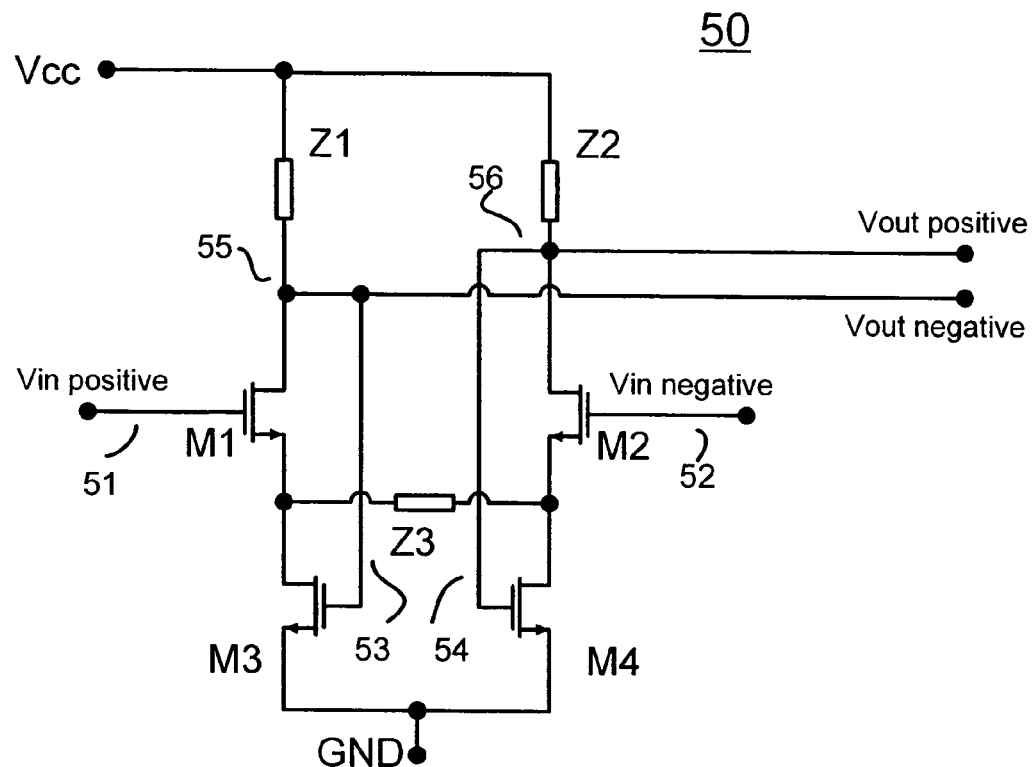
FIG. 5 is a schematic diagram of a single stage differential amplifier using NMOS transistors, which shows a variation of the embodiment shown in FIG. 4.
Figure 6:
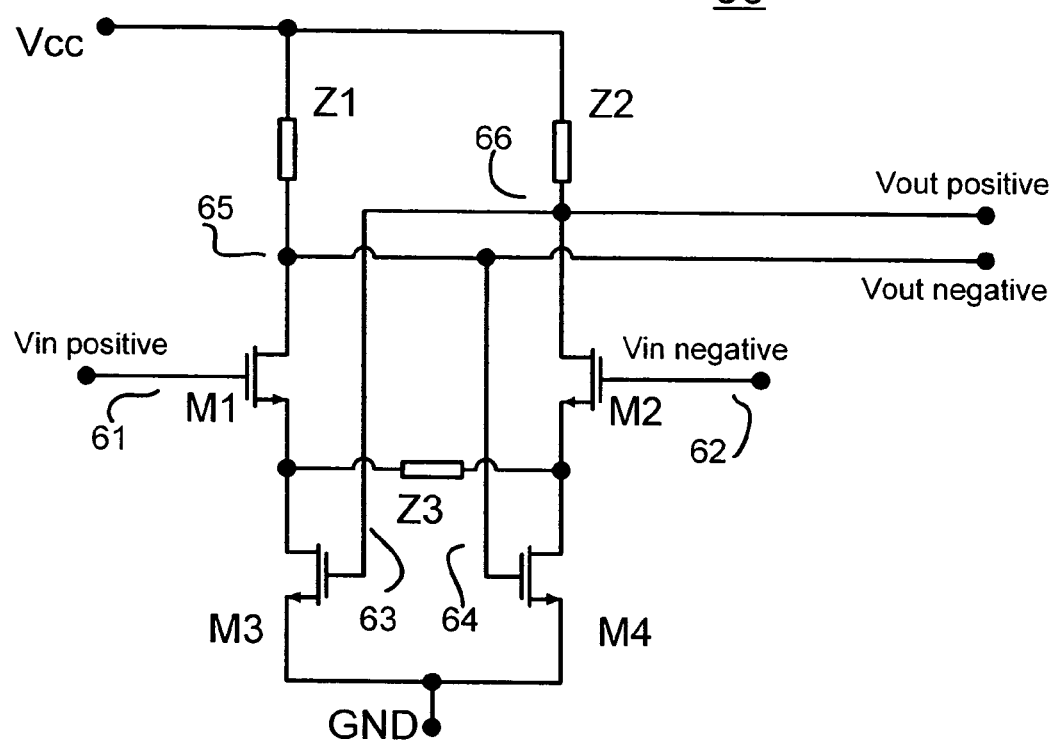
FIG. 6 is a schematic diagram of a single stage differential amplifier using NMOS transistors, which shows yet another variation of the embodiment shown in FIG. 4.

Two different embodiments of differential amplifier 40 is shown in FIGS. 5 and 6. Referring first to FIG. 5, there is shown differential amplifier 50 including a pair of transistors M1, M2 connected by their sources through degenerating impedance element Z3. Transistor M1 includes an electrical path 51 for receiving the Vinput positive signal and transistor M2 includes electrical path 52 for receiving the Vinput negative signal. The output differential signal between Voutput negative and Voutput positive nodes is provided between first electrical path 55 and second electrical path 56. In addition, the Voutput negative signal is fed back by way of feedback loop 53 into the gate of transistor M3. The Voutput positive signal is fed back into the gate of transistor M4 by way of feedback loop 54. The sources of transistors M3 and M4 are connected together to a ground reference potential.

It will be appreciated that the feedback provided through feedback path 53 into tail-current transistor M3 and the feedback provided by way of feedback path 54 into tail-current transistor M4 are of a negative type. Therefore, the overall gain is reduced at the lower frequencies. At the higher frequencies, however, the feedback efficiency decreases and, consequently, the differential amplifier gain increases. In addition, impedance element Z3 contributes to the overall transfer characteristics of differential amplifier 50. It will be further appreciated that the feedback through tail-current transistor M3 and tail-current transistor M4 provide a self biasing method for the input gate terminals of transistors M3 and M4. As such, the DC common mode output of the Voutput positive and the Voutput negative nodes is stabilized, even though the supply reference of Vcc may fluctuate.

Still another embodiment of differential amplifier 40 is shown in FIG. 6. As shown, differential amplifier 60 is similar to differential amplifier 50, except that the Voutput positive signal is fed back to the gate of tail-current transistor M3, by way of electrical path 63. In addition, the Voutput negative signal is fed back to the gate of tail-current transistor M4, by way of electrical path 64. In this manner, the Voutput positive node controls the input terminal of the M3 transistor and the Voutput negative node controls the input terminal of the M4 transistor. Because the feedback polarity is changed, the total gain of differential amplifier 60 is greater than the total gain provided by differential amplifier 50 (shown in FIG. 5).

Still describing FIG. 6, electrical path 61 provides the Vinput positive signal into the gate of transistor M1 and electrical path 62 provides the Vinput negative signal into the gate of transistor M2. The first electrical path of differential amplifier 60 is designated 65, and the second electrical path of differential amplifier 60 is designated 66. Furthermore, the feedback path into transistor M3 is provided by way of feedback path 63, and the feedback path into transistor M4 is provided by way of feedback path 64.

The embodiment shown in FIG. 5 may also be implemented using bipolar transistors instead of the M1 and M2 MOS transistors. The tail transistor may also be implemented using a bipolar transistor, however, a level shift between stage M1 and M2 is required by way of emitter followers as shown in FIG. 7.

Figure 7:
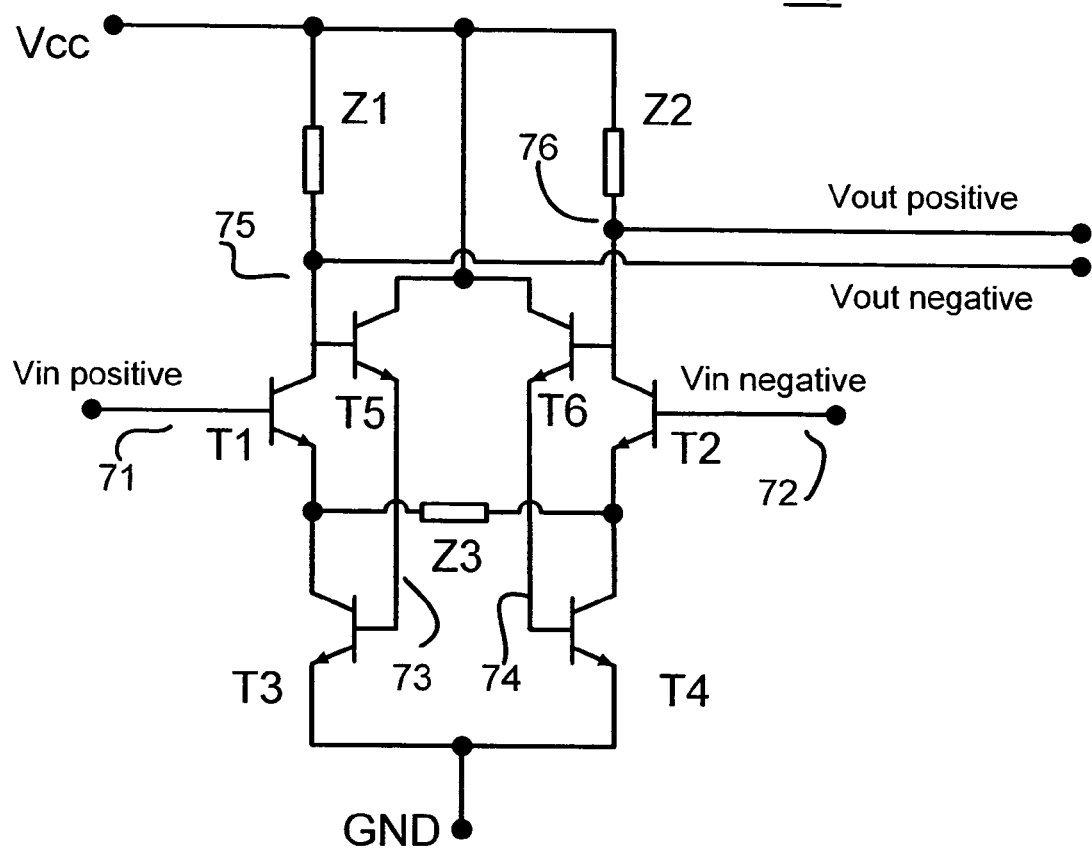
FIG. 7 is a schematic diagram of a single stage differential amplifier using bipolar transistors, in accordance with still another embodiment of the present invention.

Referring last to FIG. 7, differential amplifier 70 is another variation of differential amplifier 50. Instead of using MOS transistors, however, bipolar transistors are used. Differential amplifier 70 includes impedance loads Z1 and Z2 and degenerating impedance element Z3. Also included are bipolar transistors T1 and T2 for providing the single stage of amplification, and bipolar tail-current transistors T3 and T4 for biasing bipolar transistors T1 and T2, respectively. First electrical path 75 provides the Voutput negative signal, and second electrical path 76 provides the Voutput positive signal.

Unlike differential amplifier 50, differential amplifier 70 includes emitter follower T5 for providing a level voltage shift between the collector of transistor T1 and the input base of transistor T3. Similarly, emitter follower T6 is included for providing a level voltage shift between the collector of transistor T2 and the input base of transistor T4. One feedback path 73 is connected between the emitter of transistor T5 and the input base of transistor T3. The other feedback path 74 is connected between the emitter of transistor T6 and the input base of transistor T4.

It will be understood that differential amplifiers 10 and 30, shown respectively, in FIGS. 1 and 3, may be used as a single stage amplifier for providing a high gain to a differential input signal. A possible use for differential amplifiers 40, 50, 60 and 70, shown respectively, in FIGS. 4-7, may include a frequency dependent amplifier which provides an active filter. By selecting the values of the components shown in FIGS. 4-7, the transfer function of the active filter may accommodate the required needs of the individual designer.

Still another application of the differential amplifiers shown in FIGS. 4 and 6 may be as frequency generators, or oscillators. In such application, the components of the differential amplifier may be selected to provide a sustained oscillation condition at one frequency. Yet another possible application for the differential amplifiers shown in FIGS. 1 and 3 may be as a DC offset monitor in an offset compensation circuit.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A single stage differential amplifier comprising
   a first electrical path formed directly between an output node of a single first transistor and a first load impedance,
   a second electrical path formed directly between an output node of a single second transistor and a second load impedance,
   third and fourth electrical paths coupled, respectively, to first and second biasing nodes of the single first and second transistors for providing a differential voltage input signal between the first and second biasing nodes,
   a tail-current transistor coupled to the first and second transistors for providing a current through each of the first and second electrical paths,
   a differential voltage output signal provided directly between the first and second electrical paths and provided directly between the output nodes of the single first and second transistors, the differential voltage output signal providing amplification for the single stage differential amplifier,
   an input end of a feedback amplifier coupled directly to the first and second electrical paths for receiving the differential voltage output signal, the input end of the feedback amplifier connected in parallel to the differential voltage output signal, and
   an output end of the feedback amplifier coupled directly to the tail-current transistor for adjusting the current provided through each of the first and second electrical paths,
   wherein an input end of the feedback amplifier, being a feedback operational amplifier, includes a non-inverting input terminal and an inverting input terminal, each terminal coupled directly to one or the other of the output nodes of the single first and second transistors,
   the output nodes of the single stage differential amplifier are connected to two first conductive lines for directly outputting the differential voltage output signal to an external location from the single stage differential amplifier, and
   the output nodes of the single stage differential amplifier are connected to two second conductive lines for directly sending the differential voltage output signal to the input end of the feedback amplifier.

2. The differential amplifier of claim 1 wherein
   the first and second transistors are first and second bipolar transistors, respectively, and the first and second biasing nodes are first and second bases, respectively,
   the first electrical path is formed between a first collector of the first transistor and the first load impedance,
   the second electrical path is formed between a second collector of the second transistor and the second load impedance, and
   a first emitter of the first transistor and a second emitter of the second transistor are connected together and coupled to an output node of the tail-current transistor.

3. The differential amplifier of claim 2 wherein
   the inverting and non-inverting input terminals, respectively, of the feedback amplifier are connected directly to the first and second collectors, and
   the output end of the feedback amplifier is connected directly to an input node of the tail-current transistor.

4. The differential amplifier of claim 1 wherein
   the first and second transistors are, respectively, first and second N-type metal-oxide semiconductor (NMOS) transistors and the first and second biasing nodes are, respectively, first and second gates,
   the first electrical path is formed between a first drain of the first NMOS transistor and the first load impedance,
   the second electrical path is formed between a second drain of the second NMOS transistor and the second load impedance, and
   a first source of the first NMOS transistor and a second source of the second NMOS transistor are connected together and coupled to an output node of the tail-current transistor.

5. The differential amplifier of claim 2 wherein
   the inverting and non-inverting input terminals, respectively, of the feedback amplifier are connected directly to the first and second drains, and
   the output end of the feedback amplifier is connected directly to an input node of the tail-current transistor.

6. The differential amplifier of claim 1 wherein
the first and second load impedances are each one of a resistor, a capacitor, an inductor, or any combination of a resistor, a capacitor and an inductor.

7. The differential amplifier of claim 1 wherein
the first load impedance is substantially equal to the second load impedance, and
the first transistor is substantially similar to the second transistor.

8. The differential amplifier of claim 1 wherein
the first and second electrical paths provide the differential voltage output as a single stage of amplification with respect to the third and fourth electrical paths, and
the feedback amplifier is configured to increase the current provided through each of the first and second electrical paths and, in turn, substantially increase a gain value of the single stage of amplification.

9. The differential amplifier of claim 1 wherein
the first load impedance is Z1, the second load impedance is Z2, and a differential gain value of the differential amplifier, $A_{vdiff}$, includes the following expression:

$$A_{vdiff} = g_m * (Z2+Z1)/(2 - g_{mt} * A_{vfb} * (Z2-Z1))$$

where:
$g_m$ = transconductance of the first and second transistors;
$g_{mt}$ = transconductance of the tail-current transistor; and
$A_{vfb}$ = a gain value of the feedback amplifier.

10. The differential amplifier of claim 9 wherein
a single ended gain value of the differential amplifier, $A_{vop}$, includes the following expression:

$$A_{vop} = (g_m * Z2/2) + [(g_{mt} * A_{vfb} * Z2) * A_{vdiff}]/2$$

where:
$g_m$ = transconductance of the first and second transistors;
$g_{mt}$ = transconductance of the tail-current transistor; and
$A_{vfb}$ = a gain value of the feedback amplifier.

11. The differential amplifier of claim 1, wherein the first electrical path is configured to provide a single ended differential output node with respect to a ground terminal, and
the single ended differential output node is connected in parallel to an input end of the feedback amplifier.

12. The differential amplifier of claim 11, wherein the second electrical path is configured to provide another single ended differential output node with respect to the ground terminal, and
the other single ended differential output node is connected in parallel to the input end of the feedback amplifier.

* * * * *